US008410241B2

(12) United States Patent  
Towns

(10) Patent No.: US 8,410,241 B2  
(45) Date of Patent: Apr. 2, 2013

(54) OPTICAL DEVICES AND THEIR MANUFACTURE

(75) Inventors: Carl R. Towns, Suffolk (GB); Caroline Towns, legal representative, Suffolk (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 1043 days.

(21) Appl. No.: 11/722,688

(22) PCT Filed: Dec. 23, 2005

(86) PCT No.: PCT/GB2005/005060  
§ 371 (c)(1),  
(2), (4) Date: Jan. 27, 2009

(87) PCT Pub. No.: WO2006/067497  
PCT Pub. Date: Jun. 29, 2006

(65) Prior Publication Data  
US 2010/0230659 A1 Sep. 16, 2010

(30) Foreign Application Priority Data

Dec. 24, 2004 (GB) .................. 0428403.0

(51) Int. Cl.  
*C08G 75/00* (2006.01)  
*C08G 61/12* (2006.01)  
*H01L 51/54* (2006.01)  
*H01L 51/56* (2006.01)  
*C07D 333/20* (2006.01)  
*C08F 28/06* (2006.01)

(52) U.S. Cl. .......... 528/381; 528/373; 526/256; 549/74; 438/46; 257/40

(58) Field of Classification Search .................. 528/377, 528/373, 378, 381; 526/256; 549/74; 438/46; 257/40  
See application file for complete search history.

(56) References Cited

U.S. PATENT DOCUMENTS  
4,539,507 A 9/1985 VanSlyke et al.

FOREIGN PATENT DOCUMENTS

| EP | 0 544 795 | 6/1993 |
| EP | 0 643 118 | 3/1995 |
| EP | 0 686 662 | 12/1995 |
| JP | 4-021676 | 1/1992 |
| JP | 2003-267973 | 9/2003 |
| WO | WO-90/13148 | 11/1990 |
| WO | WO-94/15368 | 7/1994 |
| WO | WO-96/16449 | 5/1996 |
| WO | WO-00/53656 | 9/2000 |
| WO | WO-00/55927 | 9/2000 |
| WO | WO-02/059121 | 8/2002 |

OTHER PUBLICATIONS

Ishii et al, Hole transporting polymers and organic electroluminescent devices containing the same, Feb. 2005, Fuji Xerox Co., Ltd., Japan, Chem Abstract 142:228449.*  
Banerjee et al., "Novel Poly(arylene)s with Pendant Trifluoromethyl Groups," *Polymeric Materials Science and Engineering*, 80:98-99 (1999).  
Kreyenschmidt et al., "Thermally Stable Blue-Light-Emitting Copolymers of Poly(alkylfluorene)," *Macromolecules*, 31:1099-1103 (1998).  
Mikroyannidis et al., "Synthesis and Optical Properties of Poly(*p*-phenylenevinylene)s Bearing Tetraphenylthiophene or Dibenzothiophene Moieties Along the Main Chain," *Synth. Met.*, 142:113-120 (2004).  
Su et al., "Light Emitting Oligomers Containing 2,3,4,5-Tetraphenylthiophenyl Moiety and Silyl Linkage," *Synth. Met.*, 142:63-69 (2004).  
International Preliminary Report on Patentability for International Application No. PCT/GB2005/005060, dated Jun. 26, 2007.  
International Search Report for International Application No. PCT/GB2005/005060, dated Sep. 25, 2006.  
Search Report for Application No. GB0428403.0, dated Apr. 28, 2005.

* cited by examiner

*Primary Examiner* — Duc Truong  
(74) *Attorney, Agent, or Firm* — Marshall, Gerstein & Borun LLP

(57) ABSTRACT

A process for the preparation of a polymerizable unit for production of a hole transporting polymer for use in an optical device, which process comprises reacting

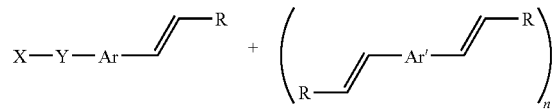

in the presence of S to form (I)

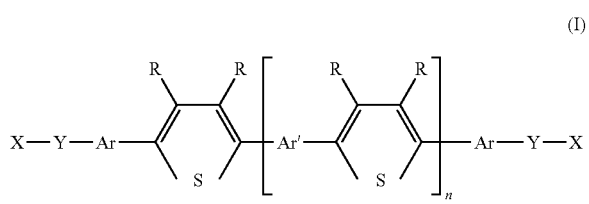

wherein each R is the same or different and is independently H or a substituent group; n is 0 or an integer from 1 to 100; Ar and Ar' are the same or different and are each aromatic or heteroaromatic groups which are substituted or unsubstituted; Y is a direct bond, a light emissive moiety, a hole transporting moiety or an electron transporting moiety; and X is a polymerizable group.

22 Claims, 1 Drawing Sheet

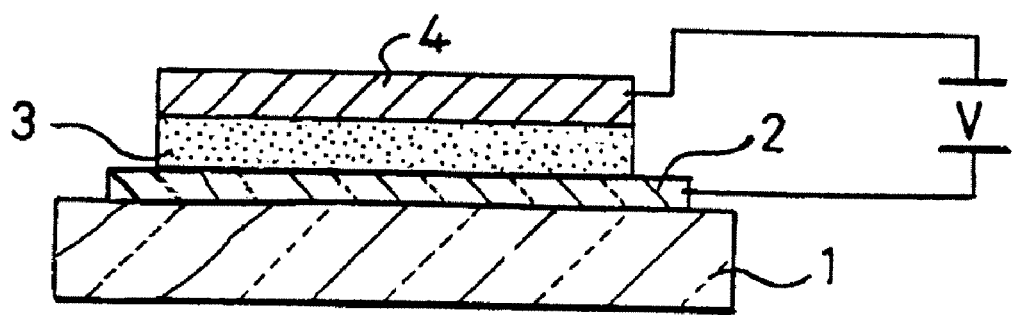
(Prior Art)

OPTICAL DEVICES AND THEIR MANUFACTURE

BACKGROUND OF THE INVENTION

1. Field of the Invention

The present invention relates to optical devices, hole transporting polymers therefore, and the manufacture of such polymers from polymerizable units. The invention further relates to a process for the preparation of such polymerizable units.

2. Related Technology

Organic light emissive devices generally comprise a cathode, an anode and an organic light emissive region between the cathode and the anode. Light emissive organic materials may comprise small molecular materials such as described in U.S. Pat. No. 4,539,507 or polymeric materials such as those described in PCT/WO/13148. The cathode injects electrons into the light emissive region and the anode injects holes. The electrons and holes combine to generate photons.

Organic photovoltaic devices also generally comprise a cathode, an anode and an organic photoresponsive region between the cathode and the anode. Such devices are described in WO96/16449. The photoresponsive region absorbs light and creates pairs of electrons and holes which are collected by the electrodes, forming an electric current which can be used to drive an electronic device.

FIG. 1 shows a typical cross-sectional structure of an optical device. The device is typically fabricated on a glass or plastics transparent substrate 1 coated with a transparent anode 2 such as an indium-tin-oxide (ITO) layer. The ITO coated substrate is covered with at least a layer of a thin film of a photoresponsive or electroluminescent organic material 3 and a cathode material 4 of low work function metal such as calcium is applied, optionally with a capping layer of aluminum (not shown). Other layers may be added to the device, for example to improve charge transport between the electrodes and the photoresponsive or light emissive material. The device shown is a light emissive device with a power source connected to the electrodes. In a photovoltaic device the electrodes would be connected to the device to be driven.

A charge transport layer which is often used in electroluminescent and photovoltaic devices is a hole transport layer situated between the anode and the light emissive or photoresponsive region. This layer transports holes from the anode to the light emissive or photoresponsive region. Polyethylene dioxythiophene (PEDOT) is a material generally used for this layer which provides an energy level between indium tin oxide at the anode and, say, PPV as the emissive material. PEDOT is disclosed in EP0686662. PEDOT is a polythiophene which is electron-rich and therefore useful as a hole transporting polymer.

Hole and electron transport to a light emissive region of an optical device is discussed in WO00/55927. According to this disclosure, rather than have hole and/or electron transport regions formed from discrete layers in a multilayer device, one or both of the hole and electron transporting regions is formed in a single polymer. Various monomeric repeat units are proposed for use in this arrangement, including terthiophene units. However, the approach is limited by the availability of monomer units and their ability to be polymerized according to the methods described. No synthetic route to thiophene-rich polymers is described.

Outside of the field of optical devices, polyarylenes with pendant trifluoromethyl groups have been described by Banerjee et al in Polymeric Materials Science and Engineering (1999), 80, 98-99. Rigid rod polymers useful for their high mechanical strength are described. Various triaryl monomers were synthesized by palladium catalyzed cross-coupling of 4-chloro-3-trifluoromethyl phenyl boronic acid with dibromo benzene, pyridine and thiophene compounds. These monomers were polymerized to form polymers.

A need exists for the provision of novel hole transporting polymers for use in optical devices. Accordingly, in a first aspect, the invention provides a process for the preparation of a polymerizable unit for production of a hole transporting polymer for use in an optical device, which process comprises reacting

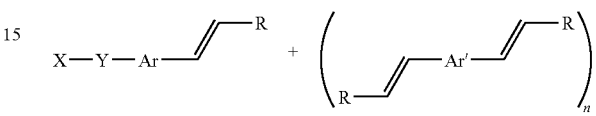

in the presence of S to form

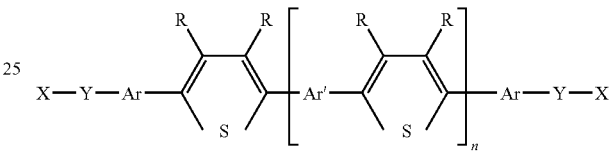

wherein each R is the same or different and is independently H or a substituent group; n is O or an integer from 1 to 100; Ar and Ar' are the same or different and are each aromatic or heteroaromatic groups which are substituted or unsubstituted; Y is a direct bond, a light emissive moiety, a hole transporting moiety or an electron transporting moiety; and X is a polymerizable group.

The invention further provides a process for the preparation of a hole transporting polymer for use in a optical device by polymering a polymerizable unit prepared as described above, optionally in the presence of at least one other polymerizable unit.

The hole transporting polymer prepared as described above may be used in an optical device. The invention also provides an optical device and a process for manufacturing the same.

BRIEF DESCRIPTION OF THE DRAWINGS

FIG. 1 is a cross-sectional view of an optical device according to the prior art.

DETAILED DESCRIPTION

Following production of the polymerizable unit, this may be polymerized to form a homopolymer which is a hole transporting polymer or may be copolymerized with at least one other polymerizable unit to form a hole transporting copolymer. A new synthetic route for the production of hole transporting polymers is therefore provided by the invention. Ready introduction of functional groups into the polymer is made possible by incorporation of the functional groups into the polymerizable unit followed by polymerisation thereof. This enables a wide range of hole transporting polymers to be produced which have other useful properties such as solubility, light emission, photoactivity for use in a photovoltaic device, electron transport properties, or further hole transport properties.

Group X is the polymerizable group which is a reactive group which enables construction of the polymer. This group may be capable of forming a homopolymer by reacting with other different polymerizable units of the same structure or may be capable of forming a copolymer by reacting with other different polymerizable units. Reactants may have the same group X on each molecule or there may be a mixture of reactants in which some have a first polymerizable group (for example Br) and others have a different polymerizable group (for example, a boron derivative). Typical polymerizable groups are those which react directly with the polymerizable groups on other monomers optionally in the presence of a catalyst. Preferably, the polymerizable group is capable of reacting in a Suzuki reaction, a Yamamoto reaction, a Gilch reaction, a Stille reaction, or a Heck reaction.

Application of the Suzuki reaction to preparation of conjugated polymers is described in WO00/53656, the contents of which are incorporated herein by reference. Conjugated polymers are prepared by polymerizing in a reaction mixture (a) an aromatic monomer having at least two reactive boron derivative groups selected from a boronic acid group, a boronic ester group and a borane group, and an aromatic monomer having at least two reactive halide functional groups; or (b) an aromatic monomer having one reactive halide functional group and one reactive boron derivative group selected from a boronic acid group, a boronic ester group and a borane group. The reaction mixture comprises a catalytic amount of a palladium catalyst and an organic base in an amount sufficient to convert the reactive boron derivative groups into —B(OH)$_3$ anions. The polymerizable group may be a reactive halide. Reactive sulphate groups such as tosylate groups may also be used in the Suzuki reaction.

A Yamamoto reaction is a polymerization reaction which involves nickel-mediated coupling of dibromide monomers. This is described in "Macromolecules", 31, 1099-1103 (1998). Accordingly, the polymerizable group is capable of reacting in a Yamamoto reaction when it comprises a halide such as a bromide.

When the polymerizable group is capable of reacting in a Gilch reaction, it comprises a halomethyl group. Examples of the Gilch reaction used to form polymers for optical devices may be found in EP0544795 in particular where precursor polymers are formed from monomers using the Gilch reaction.

The Heck reaction involves generally a palladium catalyzed reaction between a vinyl functionality and an aryl or alkyl halide. Accordingly, the polymerizable group for a Heck reaction is a vinyl or halide group.

A Stille reaction is generally a palladium catalyzed substitution and addition involving organotin compounds. The polymerizable group in a Stille reaction may be a stannate or a halide such as an iodide.

The Ar and Ar' groups are the same or different and each are aromatic or heteroaromatic groups. It is preferred that each group is aromatic to retain conjugation along the polymer backbone and more preferred that each aromatic group is a phenyl group. Heteroaromatic groups may be selected which include nitrogen containing aromatic rings such as pyridines and pyrimidines. The aromatic or heteroaromatic groups may be substituted or unsubstituted. When substituted, the substituents must possess steric and electronic properties which do not interfere with the reaction process or process of polymerization. The substituent may function to alter the bandgap of the hole transporting polymer or may alter the solubility properties of the polymer, once the polymerizable unit has been polymerized.

Such substituents include alkyl, heteroalkyl, perfluoroalkyl, alkyaryl, arylalkyl, heteroaryl, aryl, alkoxy, thioalkyl or cyano substituents.

R groups according to the invention may be selected to perform a number of different functions. Generally, each R is alkyl, heteroalkyl aryl or heteroaryl and may form a ring with another R group. The R groups may be solubilising groups, for example to increase the solubility of the polymerisable unit and/or hole transporting polymer in an organic solvent. Non-polar solubilising groups are preferred for this role. Such groups include alkyl, heteroalkyl, perfluoroalkyl, alkyaryl, arylalkyl, heteroaryl, aryl, alkoxy, thioalkyl or cyano groups.

The R groups may have functionality which gives the hole transporting polymer one or more additional properties. For example, the R groups may be selected from light emissive substituents, hole transporting substituents and electron transporting substituents. Each of these substituents may play a part in the properties of the hole transporting polymer once formed from the polymerisable unit.

Among light emissive substituents may be included fluorescent or phosphorescent side chains. Suitable phosphorescent side chains include phosphorescent metal chelates such as tris(2-phenylpyridine)iridium(III) or bis[2-(2'-benzothienyl) pyridinato-N,C$^{2'}$]acetylacetonate iridium(III)

The R groups may also be hole transporting substituents which are generally electron-rich side groups such as triarylamines. Electron transporting substituents may also be incorporated. These R groups include benzothiadiazoles.

Turning now to Y, in its simplest embodiment, Y is a direct bond linking the Ar group to the polymerizable group. Y can also be a functional moiety which forms part of the polymer backbone once the polymerizable unit has been polymerized to form the hole transporting polymer. In this case, the moiety may have a direct bearing on the properties of the hole transporting polymer. Y may be selected from a light emissive moiety, a hole transporting moiety and an electron transporting moiety to confer on the polymer these functions when the polymer is used in an optical device.

The light emissive moiety may comprise conjugated aromatic segments.

The hole transporting moiety may comprise triarylamines.

The electron transporting moiety may comprise benzothiadiazoles.

In each case, moiety Y must not interfere significantly with the formation of the polymerizable unit or the polymerization of the polymerizable unit to form the hole transporting polymer.

According to a preferred embodiment, Y is a hole transporting moiety which is electron-rich. Preferably, Y comprises Ar$^1$—N—Ar$^2$ in which Ar$^1$ and Ar$^2$ are the same or different and are each aromatic or heteroaromatic groups which are substituted or unsubstituted, and Ar$^2$ bears the polymerizable group.

In this embodiment of the invention it is preferred that Y has the general formula

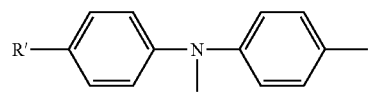

According to this embodiment, the Ar group of the polymerizable unit is attached to the nitrogen of the Y group to form a triarylamine in which the polymerizable group is attached to the Ar$^2$ phenyl group as a para-substituent. R' may be selected from alkyl, heteroalkyl, perfluoroalkyl, alkyaryl, arylalkyl, heteroaryl, aryl, alkoxy, thioalkyl or cyano. R' may solubilize the monomer and modify the bandgap. The polymerizable unit produced thereby is a particularly useful hole transporting component for use in a hole transporting polymer. The polymerizable unit is preferably constructed as follows:

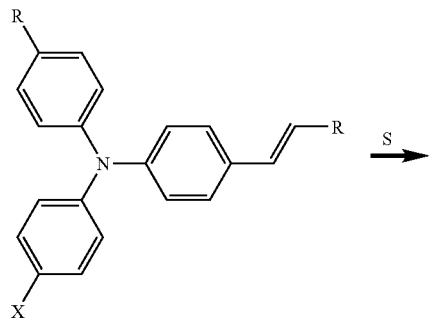

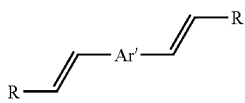

react with sulfur and the first reactant to generate n+1 thiophene rings in the polymerisable unit. Each R group of the second reactant is independently the same as or different from that of the first reactant and is independently H or a substituent group as defined above. Where the R groups are different from one another, a mixture of polymerizable units will be produced. The pattern of substitution in the thiophene rings of the mixture will comprise a statistical distribution of polymerizable units of the R groups according to how the reactants have reacted with one another. In this way no interference with the formation of the polymerizable unit takes place. In accordance with this embodiment, the following reaction may take place in which the polymerizable group is preferably Br:

In this way, a particularly electron-rich, easily oxidizable, low bandgap material can be produced.

The polymerizable unit may be a monomer, an oligomer or a polymer. This would depend upon the value for n. Where n is 0 the reaction of the first reactant

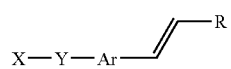

with S produces the monomer unit

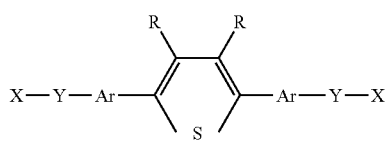

In its simplest form where R is H, in the absence of a polymerizable group X, this would be a synthesis of 2,5-diphenyl thiophene from styrene. This is known as the Baumann-Fromm reaction and was first reported by Baumann and Fromm in 1895.

Where n is an integer from 1 to 100, the polymerizable unit becomes an oligomer or polymer; n is preferably 20, more preferably 10 and most preferably 5. Here, molecules of the second reactant

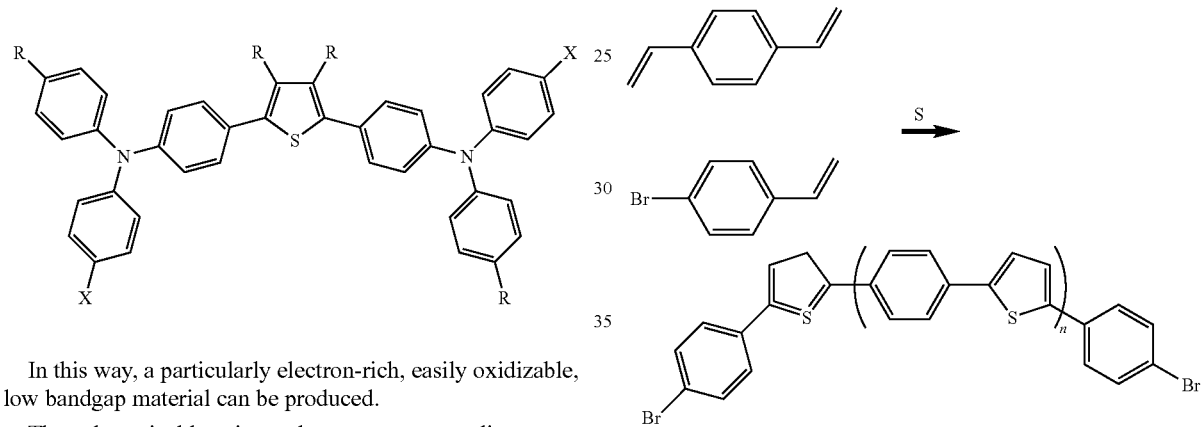

In accordance with the invention, therefore, choice of suitable reactants may confer on the hole transporting polymer different functions in addition to the hole transporting function. As discussed above, these functions, which may include a light emissive function or electron transporting function, may be conferred by the use of side chain substituents present in the polymerizable unit or by the use main chain moieties present in the polymerizable unit which form part of the polymer backbone once the polymerizable unit has polymerized.

In the process for the preparation of the hole transporting polymer, the polymerizable unit may be polymerized in the presence of at least one other polymerizable unit so as to form a copolymer. This provides a further means by which additional functional units may be incorporated in the hole transporting polymer. The at least one other polymerizable unit may comprise a light emissive unit, a hole transporting unit or an electron transporting unit. Among suitable light emissive units may be selected: conjugated aromatic segments. Among suitable hole transporting units may be selected: triarylamines. Among suitable electron transporting units may be selected: benzothiadiazoles.

In accordance with a further aspect of the invention, there is provided use of a polymerizable unit of general formula I for the production of a hole transporting polymer for use in an optical device, wherein each R is the same or different and is independently H or a substituent group; n is 0 or an integer from 1 to 100; Ar and Ar' are the same or different and are each an aromatic group or a heteroaromatic group other than thiophene, which groups are substituted or unsubstituted; Y is a direct bond, a light emissive moiety, a hole transporting moiety or an electron transporting moiety; and X is a polymerizable group.

In a further aspect, the invention provides a hole transporting polymer for use in an optical device, which polymer comprises a repeat unit comprising:

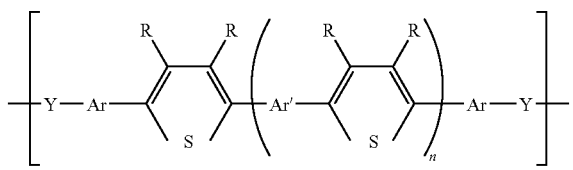

and optionally at least one other repeat unit; wherein the polymer is obtainable by a process as defined herein, in which Ar and Ar' are the same or different and are each aromatic groups or heteroaromatic groups other than thiophene, which groups are substituted or unsubstituted. Typically, the choice of the various groups of the hole transporting polymer may be such that the bandgap of the polymer is at a level which is suitably matched between the work function of the anode and the HOMO energy level of the light emissive layer in a light emissive device.

In a further aspect, the invention provides an optical device which comprises a semiconductive polymer region comprising a hole transporting polymer as described herein positioned between a pair of electrodes. Such an optical device may comprise an electroluminescent device or a photovoltaic device. Other devices include sensors and transistors.

Where the optical device is an electroluminescent device, depending on whether the hole transporting polymer is itself a light emitting polymer, a further region of light emissive material may be positioned between the hole transporting polymer and the cathode. Optionally an electron transporting layer may be positioned between the light emitting layer and the cathode. In a photovoltaic device, a photoresponsive region replaces the light emissive region.

A process for the manufacture of such an optical device is also provided. The process includes producing the hole transporting polymer as described herein. The process may further comprise depositing each layer or region of the device sequentially so as to obtain the optical device as herein described.

Generally speaking, the process for the preparation of the polymerizable unit may be conducted as follows.

Approximately 55 mmol of the olefin of interest are heated with 899 mmol elemental Sulfur to a temperature of ~240 degrees C. in a round bottomed flask fitted with a coil condenser and heated using an oil bath. When this temperature is reached gaseous H$_2$S is evolved which is scavenged using 2 bleach traps and a NaOH trap. After approximately 4 hours the bubbling stops and this signifies complete reaction. A brown solid is then recovered from the reaction mix which may be recrystallised from a variety of solvents yielding the required monomer.

The invention will now be described in further detail, by way of example only, with reference FIG. 1.

4-bromostyrene (10 g 0.055 mole) sulfur (2.86 g 0.089 moles) were heated in a RB flask fitted with a condenser which in turn was fitted to two gas traps filled with sodium hypochlorite (~500 ml) and a third with a solution of sodium hydroxide (~100 ml)

Once the boiling point of 4-bromostyrene was reached, all the sulfur had dissolved (oil bath temperature 140° C.). The amount of 4-bromostyrene boiling off decreased constantly and the colour changed from yellow to brown, at this point the water condenser was turned of. At ~200 C, the solution stopped boiling. At ~210 C evolution of a gas presumed to be hydrogen sulphide set in. At 230-245 C significant amounts of gas presumed to hydrogen sulphide evolved. The reaction temperature of 240-250 (oil bath temperature) was maintained for ~3 hrs (until gas evolution ceased) producing a dark solid presumed to be crude.

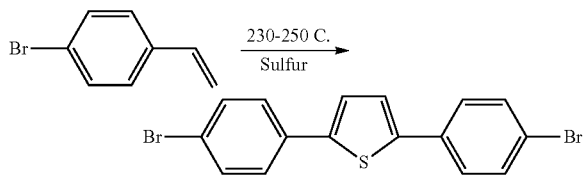

The invention claimed is:

1. A process for the preparation of a polymerizable unit for production of a hole transporting polymer for use in an optical device, which process comprises reacting

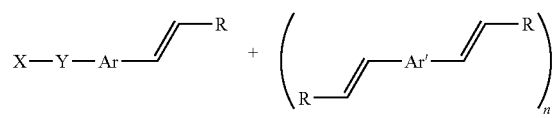

in the presence of S to form

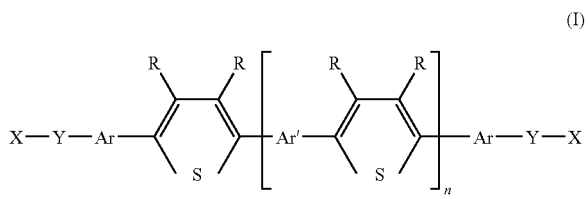

(I)

wherein each R is the same or different and is independently H or a substituent group; n is 0 or an integer from 1 to 100; Ar and Ar' are the same or different and are each aromatic or heteroaromatic groups which are substituted or unsubstituted; Y is a direct bond, a light emissive moiety, a hole transporting moiety or an electron transporting moiety; and X is a polymerizable group.

2. A process according to claim 1, wherein each Ar group is a phenyl group.

3. A process according to claim 1, wherein n is an integer and each Ar' group is a phenyl group.

4. A process according to claim 1, wherein each R is alkyl, heteroalkyl, perfluoroalkyl, alkyaryl, arylalkyl, heteroaryl, aryl, alkoxy, thioalkyl or cyano, or forms a ring with another R.

5. A process according to claim 1, wherein at least some R groups are solubilizing groups for increasing solubility in an organic solvent.

6. A process according to claim 1, wherein at least some R groups are selected from light emissive substituents, hole transporting substituents, and electron transporting substituents.

7. A process according to claim 1, wherein the polymerizable group is capable of reacting in a Suzuki reaction, a Yamamoto reaction, a Gilch reaction, a Stille reaction, or a Heck reaction.

8. A process according to claim 7, wherein the polymerizable group is capable of reacting in a Suzuki reaction and comprises a reactive sulfate or a reactive halide group.

9. A process according to claim 7, wherein the polymerizable group is capable of reacting in a Yamamoto reaction and comprises a halide.

10. A process according to claim 7, wherein the polymerizable group is capable of reacting in a Gilch reaction and comprises a halomethyl group.

11. A process according to claim 1, wherein Y is a hole transporting moiety which comprises $Ar^1$—N—$Ar^2$ in which $Ar^1$ and $Ar^2$ are the same or different and are each aromatic or heteroaromatic groups which are substituted or unsubstituted, and $Ar^2$ bears the polymerizable group.

12. A process according to claim 11, wherein Y is

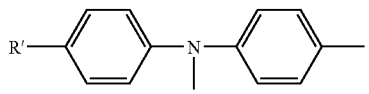

in which R' is H or a substituent group for modifying solubility or electronic properties of the polymer.

13. A process for the preparation of a hole transporting polymer for use in an optical device, which process comprises producing a polymerizable unit according to the process of claim 1, and polymerizing the polymerizable unit optionally in the presence of at least one other polymerizable unit.

14. A process according to claim 13, wherein the at least one other polymerizable unit comprises a light emissive unit, a hole transporting unit, or an electron transporting unit.

15. A polymerizable unit obtained from a process according to claim 11.

16. A polymerizable unit according to claim 15, which has the following general formula:

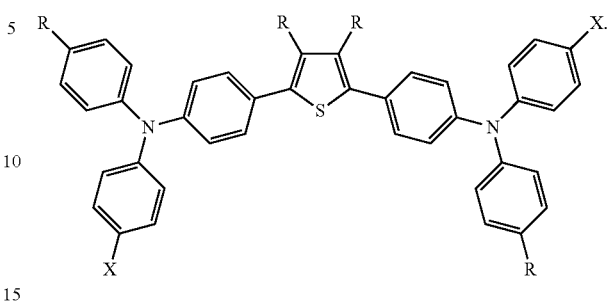

17. A hole transporting polymer for use in an optical device, which polymer comprises a repeat unit comprising:

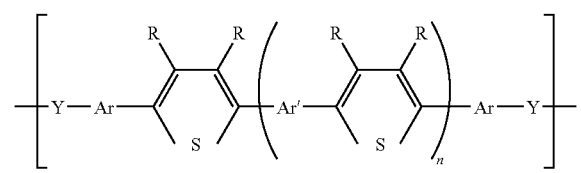

and optionally at least one other repeat unit; wherein the polymer is obtained by a process according to claim 13, in which Ar and Ar' are the same or different and are each aromatic groups, other than thiophene or heteroaromatic groups, which groups are substituted or unsubstituted.

18. An optical device which comprises a semiconductive polymer region comprising a hole transporting polymer according to claim 17, positioned between a pair of electrodes.

19. An optical device according to claim 18, which comprises an electroluminescent device or a photovoltaic device.

20. A process for the manufacture of an optical device comprising a semiconductive polymer region which comprises a hole transporting polymer positioned between a pair of electrodes, which process includes producing the hole transporting polymer according to the process of claim 13.

21. The polymerizable unit according to claim 15, wherein the polymerizable unit has exactly two polymerizable groups.

22. The polymerizable unit according to claim 21, wherein the polymerizable groups are capable of reacting in a Suzuki reaction, a Yamamoto reaction, a Gilch reaction, a Stille reaction, or a Heck reaction.

* * * * *